US008790466B2

(12) United States Patent
Humphrey et al.

(10) Patent No.: US 8,790,466 B2
(45) Date of Patent: Jul. 29, 2014

(54) APPARATUSES, DEVICE, AND METHODS FOR CLEANING TESTER INTERFACE CONTACT ELEMENTS AND SUPPORT HARDWARE

(75) Inventors: Alan E. Humphrey, Livermore, CA (US); Jerry J. Broz, Longmont, CO (US); Bret A. Humphrey, Livermore, CA (US); James H. Luvall, Reno, NV (US)

(73) Assignee: International Test Solutions, Inc., Reno, NV (US)

( * ) Notice: Subject to any disclaimer, the term of this patent is extended or adjusted under 35 U.S.C. 154(b) by 0 days.

(21) Appl. No.: 13/290,017

(22) Filed: Nov. 4, 2011

(65) Prior Publication Data

US 2012/0048298 A1 Mar. 1, 2012

Related U.S. Application Data

(62) Division of application No. 12/630,714, filed on Dec. 3, 2009, now Pat. No. 8,371,316.

(51) Int. Cl.
*B08B 7/00* (2006.01)

(52) U.S. Cl.
USPC .............................. 134/6; 134/902

(58) Field of Classification Search
None
See application file for complete search history.

(56) References Cited

U.S. PATENT DOCUMENTS

| 5,011,513 | A | 4/1991 | Zador et al. |
| 5,652,428 | A | 7/1997 | Nishioka et al. |
| 5,778,485 | A | 7/1998 | Sano et al. |
| 5,814,158 | A | 9/1998 | Hollander et al. |
| 5,968,282 | A | 10/1999 | Yamasaka |
| 6,019,663 | A | 2/2000 | Angell et al. |
| 6,326,413 | B1 | 12/2001 | Blackwell et al. |
| 6,733,876 | B1 | 5/2004 | Beardsley et al. |
| 6,777,966 | B1 | 8/2004 | Humphrey et al. |
| 7,202,683 | B2 | 4/2007 | Humphrey et al. |
| 7,254,861 | B2 | 8/2007 | Morioka et al. |
| 2004/0200515 | A1 | 10/2004 | Saito et al. |
| 2005/0255796 | A1 | 11/2005 | Haga |
| 2006/0151004 | A1 | 7/2006 | Terada et al. |
| 2007/0178814 | A1 | 8/2007 | Sato et al. |
| 2008/0070481 | A1 | 3/2008 | Tamura et al. |
| 2009/0212807 | A1 | 8/2009 | Chen et al. |
| 2010/0132736 | A1* | 6/2010 | Lin et al. .......................... 134/6 |

FOREIGN PATENT DOCUMENTS

| JP | 2006-165395 | 6/2006 |
| JP | 2008-070280 | 3/2008 |

OTHER PUBLICATIONS

PCT/US2010/058971 International Search Report, Dated Feb. 1, 2011.
PCT/US2010/058971 International Written Opinion, Dated Feb. 1, 2011.
EP 10163449.1 Extended European Search Report and European Search Opinion, Jan. 19, 2011.

(Continued)

*Primary Examiner* — Eric Golightly
(74) *Attorney, Agent, or Firm* — DLA Piper LLP (US)

(57) ABSTRACT

A method for predictably cleaning the contact elements and support hardware of a tester interface, such as a probe card and a test socket, while it is still in manual, semi-automated, and automated handling device and the electrical test equipment is disclosed. In the method, a cleaning device is loaded into wafer prober or packaged device handler and the pin contact elements and support hardware are contacted by the cleaning device.

10 Claims, 12 Drawing Sheets

(56) References Cited

OTHER PUBLICATIONS

European Office Action of EP 10163449.1; dated Mar. 21, 2012.
Notification of Reason for Rejection of JP2010-195329, Japanese Office Action in Japanese; dated Jun. 28, 2012.
Notification of Reason for Rejection of JP2010-195329, Japanese Office Action Translation; dated Jun. 28, 2012.
Notice of Preliminary Rejection of KR2010-0079727; Korean Office Action in Korean; dated Jun. 29, 2012.
Notice of Preliminary Rejection of KR2010-0079727; Korean Office Action Translation; dated Jun. 29, 2012.

* cited by examiner

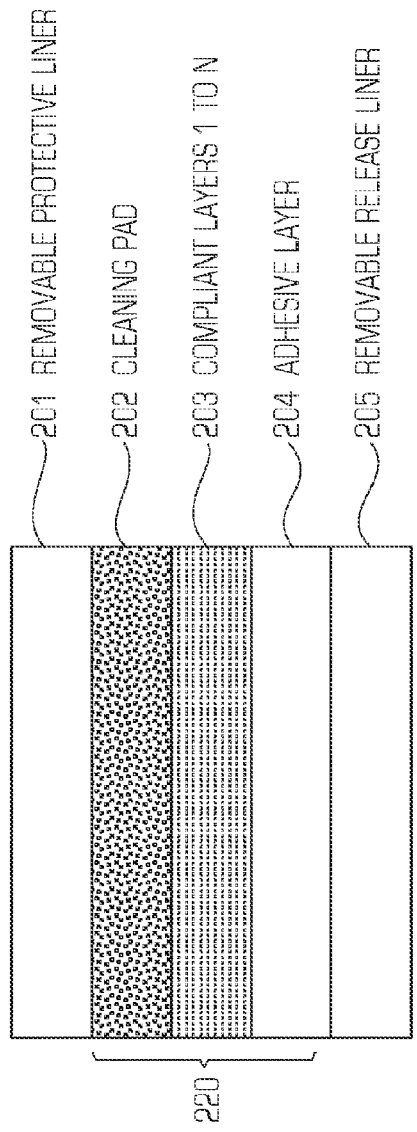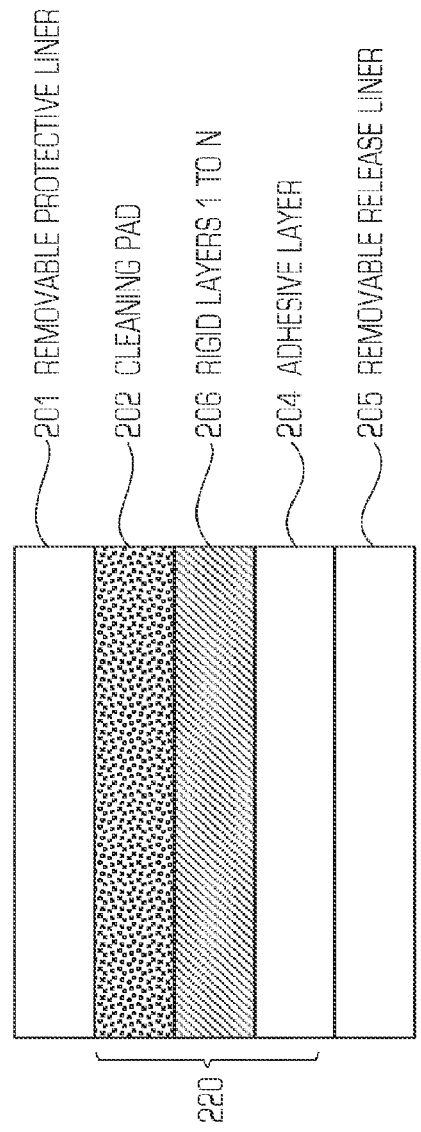

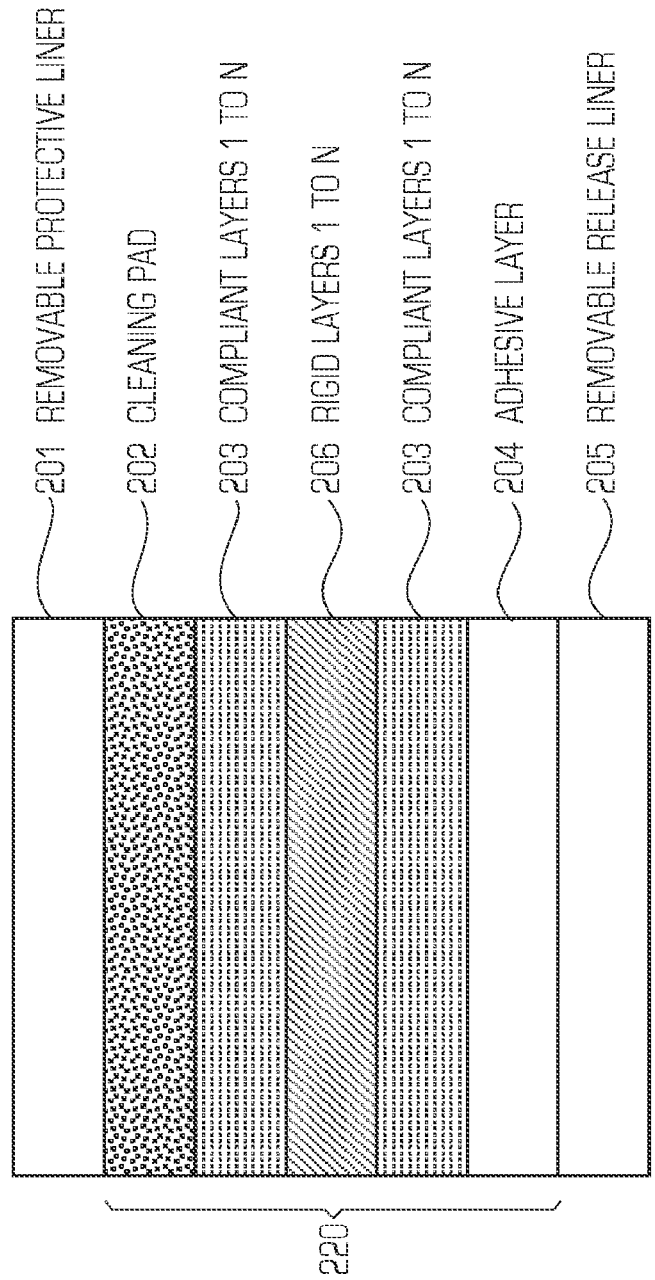

APPARATUSES, DEVICE, AND METHODS FOR CLEANING TESTER INTERFACE CONTACT ELEMENTS AND SUPPORT HARDWARE

RELATED APPLICATION/PRIORITY CLAIM

This application is a divisional of and claims priority under 35 USC 120 to U.S. patent application Ser. No. 12/630,714 filed on Dec. 3, 2009 issued as U.S. Pat. No. 8,371,316 on Feb. 12, 2013, and entitled "Apparatuses, Device, And Methods For Cleaning Tester Interface Contact Elements And Support Hardware," the entirety of which is incorporated herein by reference.

FIELD

The disclosure relates generally to a device for cleaning tester interface contact elements and support hardware.

BACKGROUND

Individual semiconductor (integrated circuit) devices are typically produced by creating a plurality of devices on a silicon wafer using well known semiconductor processing techniques that can include photolithography, deposition, and sputtering. Generally, these processes are intended to create fully-functional integrated circuit devices (ICs) at the wafer level. Eventually, the individual IC devices are singulated, or diced, into the separate and individual dies from the semiconductor wafer. Singulated IC devices are assembled for final completion in packages or incorporation into electronic apparatus using well known assembly techniques that can include die attach to a lead-frame, wire bonding or solder ball attach, and encapsulation usually by various molding techniques to provide a body to the package with external electrical connectivity.

In practice, however, physical defects in the wafer itself and/or defects in the processing of the wafer can inevitably lead to some of the dies on the wafer being either fully-functional, some of the dies being non-functional, and some of the dies have lower performance or the need for repair. It is generally desirable to identify which of the dies on a wafer are fully functional preferably prior to singulation from the wafer and assembly into consumer devices. Non-functional, lower performing, and repairable devices due to certain physical defects in the wafer, defects in the IC circuit layers, and/or defects related to the semiconductor processing techniques are identified prior to singulation by a process called wafer-level test (often referred to in the arts as "wafer sort"). Sorting, or binning, IC devices at the wafer level according to the product's capabilities where the product performance is determined by electrical testing can save the manufacturer considerable cost later in the manufacturing process as well as provide increased revenue from the sales of the highest performing devices.

Once the device has been singulated, certain process steps during handling and assembly can inevitably lead to dicing defects, handling defects, assembly and packaging related defects that can only be identified electrically to bin devices as fully-functional, non-functional, or potentially "repairable". In practice, assembled and packaged semiconductor devices are subject to a series of electrical testing processes prior to their final completion or incorporation into electronic apparatus. The process at package level or final test prior to shipment includes, but is not limited to, testing of singulated devices either bare die, packaged IC (temporary or permanent), or variants in between.

Commonly, electrical testing of the IC devices at either the wafer level or package level is accomplished by means of automatic test equipment (ATE) configured mechanically and electrically for stimulating the semiconductor devices, exercising the device according to a pre-determined test routine, and then examining the output for assessing proper functionality At wafer level test, conventional interface hardware is a "probe card" to which pluralities of probe elements that match the layout of the device under test (DUT) input/output (I/O) pads, are connected. More specifically, in the typical wafer testing process, the probe card is mounted to the prober, and probe contact elements (simply referred to as "probes") are brought into contact with bonding pads, solder balls and/or gold bumps formed on the dies of the wafer. By exerting controlled displacement of the probe tips against the bonding pads, solder balls and/or gold bumps, an electrical connection is achieved allowing the power, ground and test signals to be transmitted. Repeated scrub, deformation, and penetration of the probe tips against the bonding pads, solder balls and/or gold bumps, produces debris and contaminants that adhere and accumulate onto the probe contact surface.

At package level test, a tester load board provides interface between automated test equipment (ATE), or manual test equipment, and the DUT. The tester load board conventionally includes one or more contactor assemblies, sometimes referred to as "test socket(s)" into which DUT(s) is (are) inserted. During the testing process, a DUT is inserted or placed into the socket by the handler and held into position for the duration of testing. After insertion into the socket, the DUT, via the pin elements, is electrically connected to the ATE through the tester load board, its sub assemblies, and other interfacing apparatus. Contact pin elements associated with the ATE are placed in physical and electrical contact with the metallized contact surfaces of the DUT. These surfaces may include test pads, lead wire, pin connectors, bond pads, solder balls, and/or other conductive media. The functionality of DUTs is evaluated through various electrical inputs and measured responses on outputs. With repeated testing, the contact element tip can become contaminated with materials such as aluminum, copper, lead, tin, gold, bi-products, organic films or oxides resulting from the wafer and semiconductor device manufacturing and testing processes.

One of the major challenges encountered with both types of IC testing (wafer level and package level) is ensuring optimal electrical contact between the contact pins associated with the contactor element, and the contact surfaces of the DUT. In each test procedure, with repeated contact the pin contact elements onto bonding pads, solder balls and/or gold bumps, debris and other residuals will accumulate and contaminate the contact area of the pin elements. This debris may originate from the testing and handling process itself, or may include manufacturing residue from the device fabrication and/or assembly process(es) or from other sources.

In addition to the presence of contaminants, repeatedly forcing electrical current through the small intermetallic "a-spots" of the contact pins can degrade the conductivity characteristics of contact surfaces, thus affecting the intermetallic quality for proper electrical testing. As the contaminants accumulate, coupled with degradation of contact surfaces, the contact resistance (CRES) rises and reduces the reliability of the tests. Increasing and unstable CRES can impact yield and/or test time as yield recovery testing increases. Such erroneous readings can lead to the false rejection of otherwise good DUTs resulting in, often dramatic, yield loss. Some yield recovery may be possible through multi-pass testing; however, retesting devices multiple times to verify a bad device or to attain yield recovery causes the overall production costs to increase.

High performance demands for wafer level and package level test contactor technologies have furthered the development of uniquely shaped contact elements with predetermined and customized mechanical performance and elastic properties. Many of the new advanced contact technologies have unique contact element geometries and mechanical behavior to facilitate consistent, repeatable, and stable electrical contact. Some of the technologies are constructed using lithographic assembly techniques; while others are fabricated with high accuracy micro-machining techniques. Improved electrical characteristics of the contactors are also attained using various materials with improved electrical performance and resistance to oxidation. The contact elements are engineered to facilitate consistent oxide penetration while reducing the applied bearing force onto the bonding pads, solder balls and/or gold bumps. It is still necessary to make physical contact with the bonding pads, solder balls and/or gold bumps; thereby, generating debris and contamination that could affect the results from the electrical performance testing procedures.

Typically, the generated debris needs to be periodically removed from the contact elements to prevent a build-up that causes increased contact resistance, continuity failures and false test indications, which in turn result in artificially lower yields and subsequent increased product costs.

In response to the problem of particles adhering to the contact element and supporting hardware, a number of techniques have been developed. For example, one technique uses cleaning materials composed of a silicone rubber which provides a matrix for abrasive particles. In addition, a cleaning wafer with a mounted abrasive ceramic cleaning block which is rubbed against the probe needles may be used or a rubber matrix with abrasive particles and a brush cleaner made of glass fibers also may be used. In one technique, the probe needles may be sprayed or dipped in a cleaning solution. In another technique, open cell foam based cleaning device with a random surface morphology of voids and variable heights may be used.

In one conventional contact element cleaning process, some combination of brushing, blowing, and rinsing the contact pins and/or contactor bodies is employed. This process requires stopping the testing operation, manual intervention to perform the cleaning, and possibly removing the test interface (probe card, socket, etc.) from the test environment. This method provides inconsistent debris removal and may not provide sufficient cleaning action within the geometric features of shaped contact elements. After cleaning, the test interface must be reinstalled and the test environment reestablished so that testing may resume. In some cases, the contact elements are removed, cleaned, and replaced resulting in elevated costs due to unscheduled equipment downtime.

In another conventional method, a cleaning pad with an abrasive surface coating or abrasively coated polyurethane foam layer is used to remove foreign materials adhering to the contact elements. Adherent foreign materials are abraded off the contact elements and supporting hardware by repeatedly scrubbing the contact elements against (and possibly into) the cleaning pad. The process of cleaning using an abrasive pad burnishes the contact element but it does not necessarily remove debris. In fact, the burnishing actually causes abrasive wear to the contact elements thereby changing the shape of the contact geometry and shortening the useful life of the contactor.

Maximum cleaning efficiency is attained when the removal of the debris from the contact element and supporting hardware is performed consistently and predictably during the cleaning process. The process of cleaning using an abrasive pad constructed from open celled foam does not provide consistent cleaning. In fact, the burnishing action by the randomly oriented and uncontrolled foam structures causes non-uniform abrasive wear as well as preferential abrasive wear to the contact elements thereby unpredictably changing the shape of the contact geometry and mechanical performance of the contact element and support hardware; thereby, unpredictably shortening the useful life of the contactor.

In the industry, it has been seen that the tester interface hardware consisting of a plurality of contact elements, as many as 150,000 test probe elements, and the support hardware can cost as much as $600K per ATE test cell. Premature wear-out and damage due to improper or non-optimal cleaning practices can equate to millions of US dollars per annum per ATE test cell. Therefore, with thousands of ATE test cells operating worldwide, the impact to the repair, maintenance, and replacement costs can be very substantial.

Another attempt to improve upon the conventional probe cleaning process includes using a tacky abrasively filled or unfilled polymeric cleaning material to remove the foreign materials. More specifically, the polymer pad is brought into physical contact with the contact elements. Adherent debris is loosened by the tacky polymer and sticks to the polymer surface; thereby removed from the contact elements and other test hardware. The polymer materials are designed to maintain the overall shape of the contact elements; however, interaction with the polymer layer may not provide sufficient cleaning action within the geometric features of shaped contact elements.

When cleaning with abrasively filled or abrasively coated materials films that have a continuous, uniform surface or a surface with randomly oriented and randomly spaced surface features, preferential abrasion is manifested through "edge pin" effects (for example, peripheral contact elements of a test probe array are abrasively worn at different rates than the contact element within the array); or through "neighbor pin spacing" effects (for example, closely spaced contact elements are worn at different rates than widely spaced contact elements); or through "neighbor pin orientation" effects (for example, spatial proximity of contact elements can cause preferential and asymmetric wear of contact elements). Non-uniform abrasive wear of contact elements and support hardware will affect the performance consistency during the IC semiconductor device testing and could result in unexpected yield loss, equipment downtime, and repair costs.

Typical contact element cleaning processes at wafer level and package level testing can be expensive for the end-user since the contactors may be uncontrollably worn away at different rates by the abrasive-based contact cleaning processes. When using abrasive particles of identical composition and size, exemplary test data (FIG. 1) shows that the rate of wear-out or dimensional reduction for critical contact element geometries can be dramatically affected by relatively small changes (approximately 2 to 3%) to the compliance of the abrasive material layers, surface features, and that of the under-layers. Data curves 101, 102, 103, and 104 demonstrate the rate at which the reduction in contact element length occurs as the overall compliance of the cleaning materials is modified and reduced. Data curve 101 represents a compliant material which has the lowest wear out rate; and Data curve 104 represents a rigid compliant material which has the highest wear out rate. With thousands of IC device testing units (probers and handlers) operating worldwide, the impact to the industry from maintaining clean contact elements without premature wear out during testing can be very substantial.

None of these methods adequately address a cleaning device and method that incorporates a cleaning pad construction with multiple layers of different material and mechanical properties, predetermined geometrical features, and surface treatments to predictably control the overall cleaning material performance. In addition, the equipment and manual labor to repair and replace contactors that have been worn away by an abrasive contact cleaning process adds additional costs to the task performed. Accordingly, there is a need for improved methods and apparatuses for cleaning and maintaining the contact elements.

BRIEF DESCRIPTION OF THE DRAWINGS

FIG. 4A is a sectional view of a cleaning medium that has one or more intermediate complaint material layers below a cleaning pad layer;

FIG. 4B is a sectional view of a cleaning medium with one or more intermediate rigid material layers below a cleaning pad layer of predetermined properties;

FIG. 4D is a sectional view of a cleaning medium with one or more alternating intermediate rigid and compliant material layers beneath a cleaning pad layer of predetermined properties;

DETAILED DESCRIPTION OF ONE OR MORE EMBODIMENTS

Figure 1:
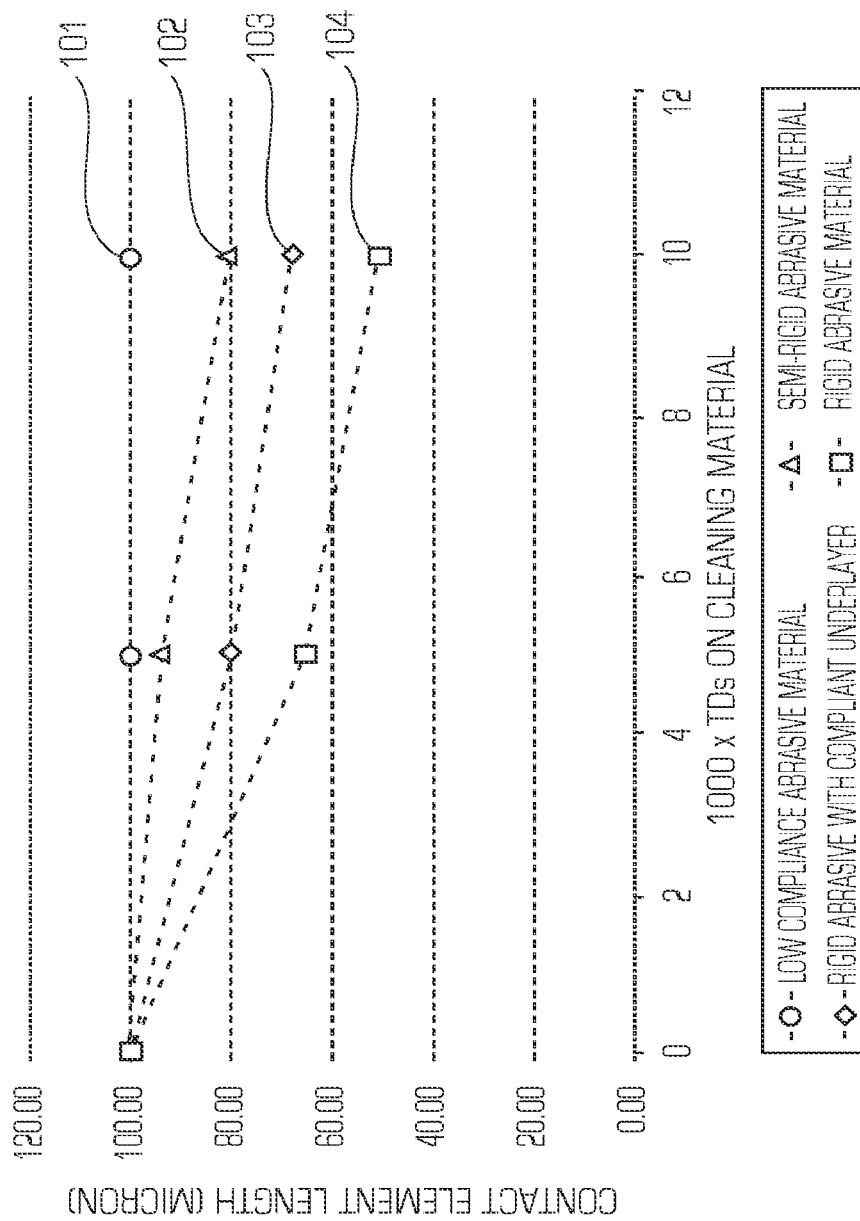
FIG. 1 shows test data showing contact element critical size reduction as a function of "touchdown" cycles on abrasive pads with a 3-um particle size, but with controlled differences in the material compliance.

The disclosure is particularly applicable to a cleaning pad for electrical test probes that have contact elements with a predetermined geometry (i.e., crown tipped spring probes, spear tipped probes, etc.) and support structures used for tester interface devices utilized for wafer level and package level testing (i.e., probe cards, test sockets, and other similar interface devices) and it is in this context that the disclosure will be described. It will be appreciated, however, that the cleaning materials, device, and method has greater utility, such as cleaning test interfaces utilized by other types of IC semiconductor device evaluation equipment, such as spring pin ring interfaces, ZIFF male/female connectors, etc.

The device is a complaint cleaning medium with surface characteristics for having specific abrasive and debris removal efficacies to clean electrical contact elements and structures used for tester interfaces devices utilized for wafer level and package level testing (i.e., probe cards, test socket, and other similar interface devices). A high level of cleaning efficacy can be obtained using appropriate intermediate layers, surface micro-features, and variable abrasiveness that can be selected, depending on the type and shape of contact elements being cleaned, the composition and the quantity of debris to be removed, and the affinity of the debris to the contact surface. The contact elements being cleaned can be any type of test probe, such as tungsten needles, vertical probes, cobra probes, MEMs type probes, plunger probes, spring probes, sliding contacts, contact bump probes formed on a membrane, etc.

In more detail, the cleaning material may be constructed from one or more layers, each with predetermined mechanical, material, and dimensional characteristics, such as abrasiveness, density, elasticity, tackiness, planarity, thickness, porosity, so that when the pin elements contact the pad surface, the contact area and surrounding support hardware are cleaned such that the debris and contaminates are removed.

The cleaning device may have a sacrificial top protective layer of material that may be applied before, during, or after the fabrication process to protect and isolate the cleaning material surface from contamination during manufacturing process and manual handling operations. The sacrificial layer is removed upon installation into the semiconductor testing equipment and is used to ensure that the working surface of the cleaning material is free of any contamination that would compromise the cleaning performance of the contact elements by cleaning material.

The individual layers of the cleaning material may be made of solid elastomeric materials or porous, open celled or closed foam materials that may include rubbers and both synthetic and natural polymers as well as polyurethanes, acrylics, etc., or other known elastomeric materials. The top layer of the cleaning material may have a predetermined abrasiveness, elasticity, density and surface tension parameters that allow the probe tips to deform and penetrate the elastomeric material to remove the debris on the contact area without damage to the geometry of the contact elements, while retaining the integrity of the elastomeric matrix.

The cleaning material also may have a multi-layered structure in which one or more complaint layers are arranged or stacked to attain a predetermined overall compliant performance so that when the pin elements contact and deform the pad surface, a defined reciprocal force is imparted by the material into the contact area and structures to increase the efficiency at which the debris and contaminates are removed. Furthermore, the cleaning material may have a multi-layered structure in which the surface layer is populated with a plurality of uniformly shaped and regularly spaced, geometric micro-features, such as micro-columns, micro-pyramids, or other such structural micro-features, of a pre-determined aspect ratio (diameter to height), cross-section (square, circular, triangular, etc.) and abrasive particle loading to improve debris removal and collection efficiency. The micro-features may be made of solid elastomeric material or porous, open celled or closed foam materials that may include rubbers and both synthetic and natural polymers as well as polyurethanes, acrylics, etc., or other known elastomeric materials. In other embodiments, the micro-features may have abrasive particles applied to the top surface, along the length of the micro-feature, within the body of the micro-feature, or at the base of the micro-feature. In particular, an average micro-feature could have a cross-section widths of 1.0-μm or more, with a height of 400-μm or less and an average abrasive particle size of less than 15.0-μm. Typical abrasives that may be incorporated into and across the material layers and micro-features may include aluminum oxide, silicon carbide, and diamond although the abrasive particles may also be other well known abrasive materials with Mohs Hardness of 7 or greater.

In other embodiments, the micro-features are mutually decoupled and formed with a predetermined geometry for a second moment of area or inertia to control the resistance to bending using an array of "streets" and "avenues" to remove undesirable interactions and other coupled effects and attain a predetermined surface compliance so that when the pin elements contact the pad surface, a reciprocal force is imparted by the material into the contact area, within the contact element tip geometry, and support structures to increase the efficiency at which the debris and contaminates are removed. The mutually decoupled micro-features have predetermined dimensions to provide predictable and uniform reciprocal forces onto each test probe within the contact element array and supporting hardware. Decoupled micro-features across the surface of the cleaning material are formed to reduce and eliminate "edge pin" effects, "neighbor pin spacing" effects, and "neighbor pin orientation" effects.

In another aspect of the cleaning device, the micro-features may have a particular uniform surface finish such that the prober/tester device is capable of detecting the surface of the cleaning pad. The surface texture and roughness of the cleaning material may also contribute to the cleaning efficiency of the working surface polymer material.

In one aspect of the method, the cleaning medium may be manually placed within the automated test equipment, such as a wafer prober or packaged device handler, in a predetermined location so that pin elements and surfaces will interact with the cleaning medium periodically to remove debris and/or clean the contact surfaces of the pin elements without excessively wearing out the test probe. In another aspect of the method, a method for cleaning the probe elements on a wafer prober or package device handler is provided wherein the method comprises loading the cleaning medium into the wafer prober or package device handler in a form similar to a semiconductor wafer, a singulated IC device, or a packaged IC device being tested and the cleaning medium having a top surface with predetermined properties, such as abrasiveness, tack, hardness, that clean the contact elements and support structure. The method further comprises contacting the contact elements with the cleaning medium during the normal testing operation in wafer prober or package device handler so that any debris is removed from the probe elements during the normal operation of the wafer prober or package device handler.

When the prober/tester is capable of detecting the surface of the cleaning pad, then the prober is able to be set into an automatic cleaning mode. In the automatic cleaning mode, the prober/tester will automatically determine when to clean the test probe contact elements, locate the cleaning device, clean the probe tips and then return to testing operations. In another embodiment of the cleaning device, the layers of the cleaning medium may be formed from conductive materials such that a tester/prober that detects a surface using conductance is able to detect the surface of the cleaning medium.

Figure 2A:
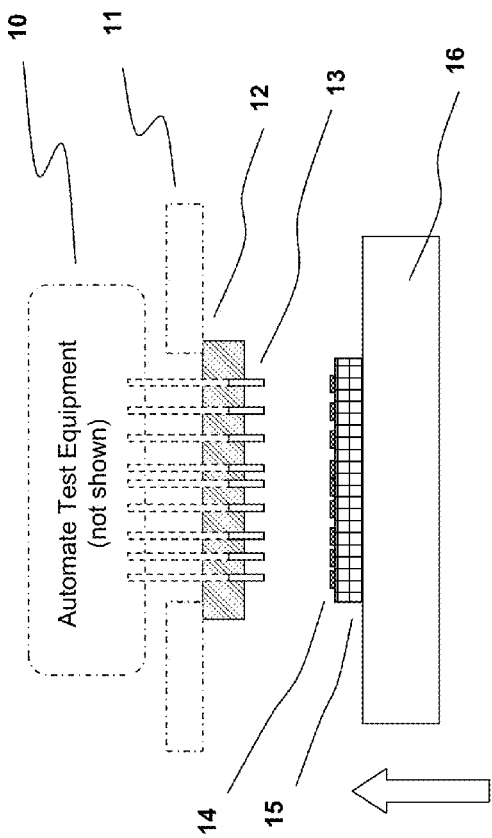
FIG. 2A illustrates a conventional example of a DUT (at wafer level or at package level) with probe pads; electrical contact elements and an ATE interface (probe card or test socket)
Figure 2B:
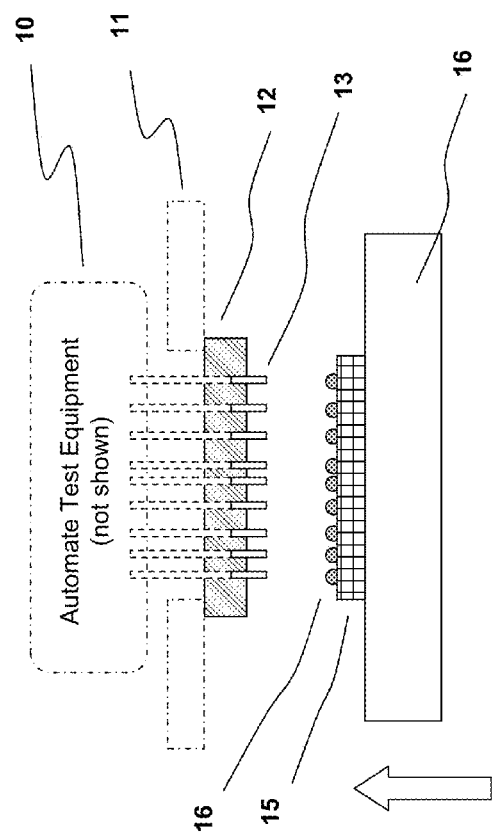
FIG. 2B is a schematic of an example of a DUT (at wafer level or at package level) with probe pads, electrical contact elements and an ATE interface (probe card or test socket)

A typical IC semiconductor testing system (shown schematically in FIGS. 2A and 2B) typically includes some type of tester 10, a test head 11, a tester interface 12 (e.g., probe card or test socket), contact elements 13, and a wafer or device handler 16. The electrical contact elements 13, or test probes, within the tester interface extend from the tester interface to allow direct contact with the DUT 15. DUTs (wafers, singulated devices, or packaged ICs) are moved using automated, semi-automatic, or manual equipment into the appropriate physical position such that probe pads 14 and/or solder balls 16 are in alignment with the contact elements 13 of the tester interface 12. Once in position, the DUT 15 is moved against the contact elements 13 or the contact elements 13 are moved against the DUT 15 for electrical testing. With repeated touchdowns, the contact elements become contaminated. Instead of the removing the test interface for cleaning, the cleaning medium of a predetermined construction will clean the geometrical defined contact elements during the normal testing operation.

Figure 3A:
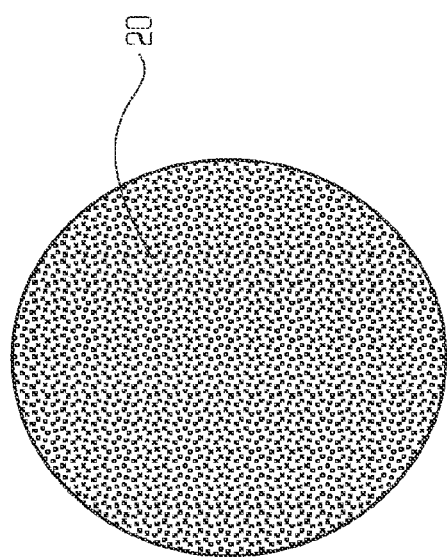
FIG. 3A is a top view of a typical cleaning device with cleaning pad applied to a wafer surface.
Figure 3B:
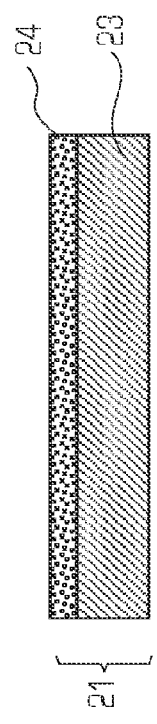
FIG. 3B is a sectional view of a typical cleaning device with a cleaning pad applied to a substrate surface.
Figure 3C:
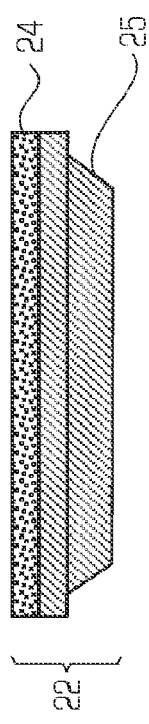
FIG. 3C is a sectional view of a typical cleaning device with a cleaning pad applied to an IC package.

FIGS. 3A, 3B, and 3C illustrate three typical different types of cleaning devices manufactured with a cleaning medium applied to various substrate materials, different size substrates, different shape substrates or without a substrate in some applications. As shown in FIGS. 3A and 3B, cleaning device 20 and 21, respectively, may include a substrate 23 and a cleaning medium, or pad, 24 secured, adhered, or applied to a surface of a wafer or to substrate of known geometry, respectively. The substrate 23 may be plastic, metal, glass, silicon, ceramic or any other similar material. Furthermore, a substrate 25 may have a geometry that approximates the geometry of the packaged IC device, or DUT, 22 whereby the cleaning medium 24 is attached to the surface bearing the contact elements of the test probes and supporting hardware.

Now, a cleaning medium with one or more intermediate complaint layers is described in more detail with reference to the accompanying drawings and embodiments. In one embodiment (shown in FIG. 4A), a cleaning medium 220 may be made from a cleaning pad layer 202 of predetermined properties, such as hardness, elastic modulus, etc., that contribute to the cleaning of the contact elements that contact the pad. The cleaning medium 220 may also have one or more intermediate compliant layers 203 attached to and below the cleaning pad layer. The combinations of layers produces material properties unavailable from the individual constituent materials, while the wide variety of matrix, abrasive particles, and geometries allows for a product or structure that has to choose an optimum combination to maximize cleaning performance. By adding compliant or microporous foam underlayers beneath a rigid cleaning layer, the overall abrasive wear characteristics of the cleaning material are reduced and/or the tip shaping performance are enhanced in order to extend the overall service life of the probe element without compromising the shape or function of the contact geometry. For example, application of the abrasive particle layer onto a rigid polyester film creates a lapping film type cleaning material with stock removal characteristics used to create and maintain a probe contact elements with flat contact area geometries. Application of the same abrasive particle layer to the surface of a compliant unfilled polymer or the "skin" side of a microporous foam, results in multi-layered material with preferential stock removal characteristics for creating and maintaining a probe contact element with a radius or semi-radius contact area geometry. As the overall compliance of the underlayer(s) is systematically increased (or rigidity is decreased), the overall abrasive wear characteristics of the cleaning material transition from creating and maintaining a flat tip contact area geometry to creating and maintaining a radius or semi-radius contact area geometry.

The cleaning medium 220 may also have a removable protective layer 201 that is installed prior to the intended usage for contact element cleaning in order to isolate the surface cleaning pad layer from non-test related contaminants. The removable protective layer 201 protects the working surface of the cleaning pad layer 202 from debris/contaminants until the cleaning device is ready to be used for cleaning a tester interface in a clean room. When the cleaning device is ready to be used for cleaning a tester interface in a clean room, the removable protective layer 201 may be removed to expose the working surface of the cleaning pad layer 202. The protective layer may be made of a known non-reactive polymeric film material and preferably made of a polyester (PET) film. The protective layer may have a matte finish or other "textured" features to improve the optical detection of the cleaning device by the testing equipment and/or improve cleaning efficiency.

Installation of the cleaning device onto the predetermined substrate material is performed by removal a second release liner layer 205 (made of the same material as the first release liner layer) to expose the adhesive layer 204, followed by application onto the substrate surface by the adhesive layer 204. The adhesive layer 204 may then be placed against a substrate adhere the cleaning device 220 to the substrate. The substrate may be a variety of different materials as described in the prior art which have different purposes.

The cleaning pad layer 202 described above and the cleaning pad layers described below may provide predetermined mechanical, material, and dimensional characteristics to the cleaning material. For example, the cleaning pad layer may provide abrasiveness (described in more detail below), a specific gravity (of a range of 0.75 to 2.27 for example) wherein specific gravity is the ratio of the density to the density of water at a particular temperature, elasticity (of a range of 40-MPa to 600-MPa for example), tackiness (of a range of 20 to 800 grams for example), planarity, and thickness (a range between 25-um and 300-um for example).

The one or more intermediate layers (which can be compliant as described above, rigid as described below or a combination of compliant and rigid layers as described below) may provide predetermined mechanical, material, and dimensional characteristics to the cleaning material. For example, the one or more intermediate layers may provide abrasiveness (described in more detail below), a specific gravity (of a range of 0.75 to 2.27 for example) wherein specific gravity is the ratio of the density of the one or more intermediate layers to the density of water at a particular temperature, elasticity (of a range of 40-MPa to 600-MPa for example), tackiness (of a range of 20 to 800 grams for example), planarity, thickness (a range between 25-um and 300-um for example), and/or porosity (a range of 10 to 150 micropores per inch for example) which is an average number of pores per inch.

Figure 4C:
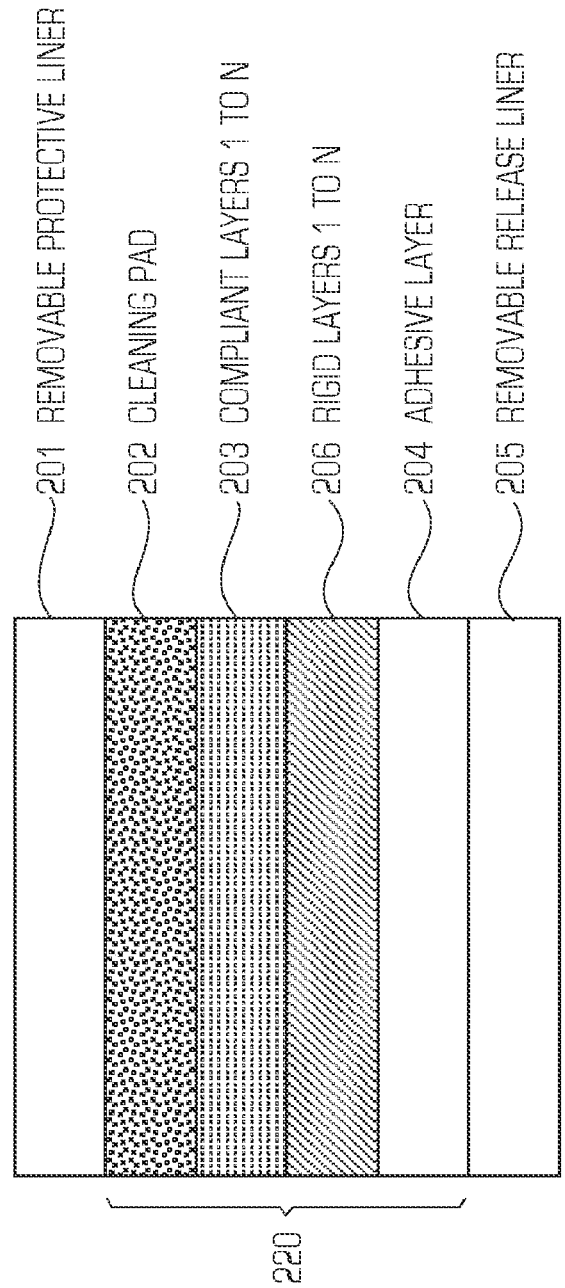
FIG. 4C is a sectional view of a cleaning medium that has one or more intermediate rigid and compliant material layers beneath a cleaning pad layer of predetermined properties.

In another embodiment shown in FIG. 4B, a cleaning medium 220 may be made from a cleaning pad layer 202 with one or more intermediate rigid layers 206 below the cleaning pad layer 202. For another embodiment (FIG. 4C), the cleaning medium 220 may be constructed using a combination of one or more intermediate rigid 206 and compliant 203 material layers beneath a cleaning pad layer 202 of predetermined properties. FIG. 4D shows an embodiment wherein the cleaning medium 220 is constructed by alternating one or more intermediate rigid 206 and compliant material layers 203 beneath a cleaning pad layer 202 of predetermined properties. The cleaning pad 202 and underlayers (203, 206, etc.) will have predetermined abrasive, density, elasticity, and/or tacky properties that contribute to cleaning the contact elements with known geometrical configurations. Superposition of the cleaning layer and intermediate material layer properties may be varied according the specific configuration and geometrical features of the contact element.

Abrasiveness of the cleaning pad layer 202 will loosen and shear debris from probe contact elements. Using predetermined volumetric and mass densities of abrasive particles; the abrasiveness of the pad can be systematically affected in order to round or sharpen the probe tips. Typical abrasive material and particle weight percentage loading within the cleaning material layer can range for 30% to 500% weight percent. As used herein, weight percent polymer loading is defined as the weight of polymer divided by the weight of polymer plus the weight of the abrasive particle. Typical abrasives that may be incorporated into the materials may include aluminum oxide, silicon carbide, and diamond although the abrasive material may also be other well known abrasive materials. The abrasive may include spatially or preferentially distributed particles of aluminum oxide, silicon carbide, or diamond although the abrasive particles may also be other well known abrasive materials with Mohs Hardness of 7 or greater. Controlled surface tackiness of the cleaning layer will cause debris on the contact element to preferentially stick to the pad and therefore be removed from the contact element during the cleaning operation.

In one embodiment, the cleaning material layer, and/or the intermediate rigid layers, and/or intermediate compliant layers (each being a "material layer") may be made of a solid or foam-based, with open or closed cells, elastomeric materials that may include rubbers and both synthetic and natural polymers. Each material layer may have a modulus of Elasticity with a range between more than 40-MPa to less than 600-MPa and the range of thickness of the layers may be between 25-um or more and less than or equal to 300-um. Each material layer may have a hardness range of layers between 30 Shore A or more and not to exceed 90 Shore A. The cleaning and adhesive layers may have a service range of between −50

C. to +200 C. Each elastomeric material may be a material manufactured with a predetermined tackiness or abrasive particles spatially or preferentially distributed within the body of the material. Each material may have a predetermined elasticity, density and surface tension parameters that may allow the contact elements to penetrate the elastomeric material layers and remove the debris on the contact element without damage to the geometrical features of the contact element, while retaining the integrity of the elastomeric matrix. Each material layer will have a predetermined thickness generally between 1 and 20 mils thick. The thickness of each layer may be varied according the specific configuration of the probe tip. For example, a thin material cleaning material layer (~1-mil thick) would be suitable for a "non-penetrating" probe geometry such as a flat contactor and a thick material cleaning layer (~20-mil) would be well-suited for a "penetrating" probe geometry such as a spear-point or a pointed buckling beam. As one or more probe elements and supporting hardware of the tester interface contact the cleaning pad during the normal operation of the automated, semi-automated, or manual DUT handling device, a vertical contact force drives the contact element into the pad where the debris on the contact elements will be removed and retained by the pad material.

Figure 5A:
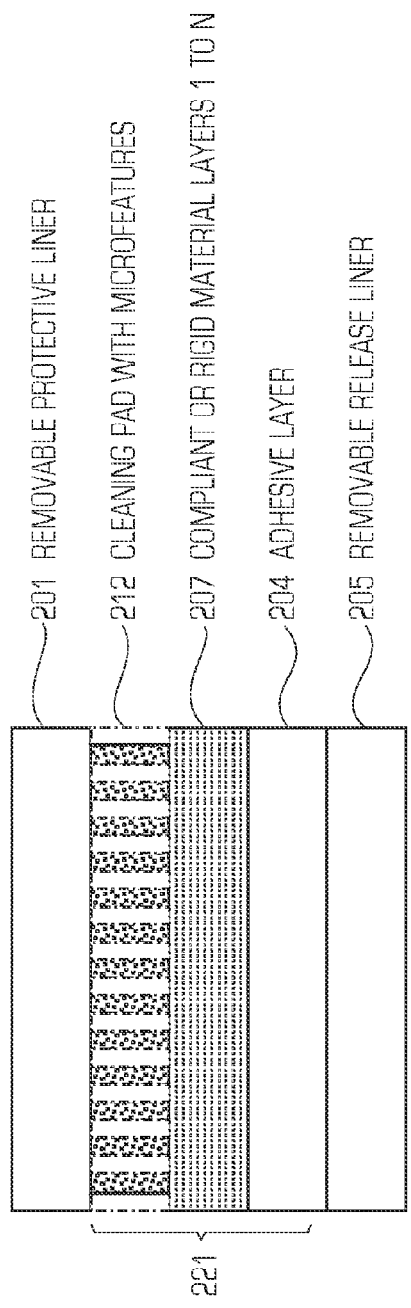
FIG. 5A is a sectional view of a cleaning material with evenly spaced micro-columns of a predetermined geometry constructed onto one or more material layers of predetermined properties.
Figure 5B:
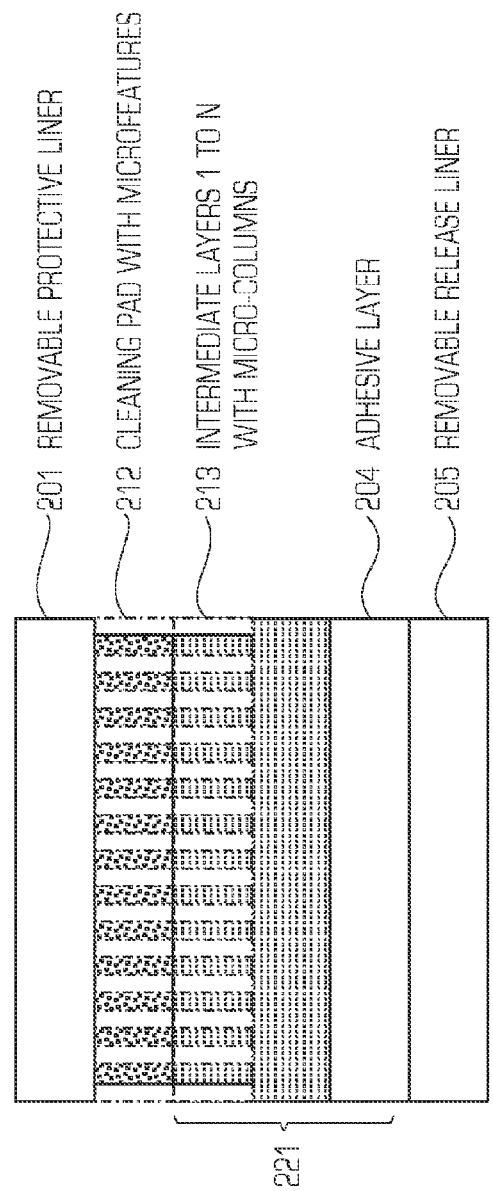
FIG. 5B is a sectional view of a cleaning material with evenly spaced micro-columns of a predetermined geometry constructed from a combination of one or more intermediate rigid and compliant material layers of predetermined properties.

In other embodiments of the cleaning medium 221 (shown in FIG. 5A and 5B), the maximum cleaning efficiency of the cleaning material can be improved using a plurality of uniformly shaped and regularly spaced, geometric micro-features, such as micro-columns 212 or micro-pyramids, of a pre-determined aspect ratio (diameter to height), cross-section (square, circular, triangular, etc.). In FIG. 5A, the spaced microfeatures are constructed from a single layer 212 across a combination of intermediate compliant or rigid layers 207 with pre-determined predetermined properties. As an example of one type of micro-feature construction, the square micro-columns shown in FIG. 5A can be created using a combination of precision fabrication and controlled cutting methods whereby the major axis has a dimension of 100-micron and the "street" and "avenue" widths are less than 50-um. The depth of the "streets" and "avenues" is controlled by the cutting methods in order to attain the aspect ratio. In this example, the features have a 100-micron major axis width to a 200-micron depth (or height). In this construction, the depth is attained without cutting through the cleaning material layer or into the underlayer(s). In FIG. 5B, the evenly spaced microfeatures may be constructed from multiple layers 213 of intermediate compliant or rigid layers 207 with pre-determined properties. The size and geometry of the micro-features may vary according the configuration and material of the contact elements to achieve a pad that will remove the debris but will not damage the probe elements. If the micro-features are large relative to the contact element geometry, this will adversely affect the cleaning performance. If the micro-features are small relative to the contact element geometry, the reciprocal force will be insufficient to facilitate a high cleaning efficiency to remove adherent contaminants.

Generally, the microfeatures can have several types of geometries including (cylinders, squares, triangles, rectangles, etc. The cross-sectional size in major axis of each micro-feature may be greater than or equal to 25-um and smaller than 300-um and each micro-feature may have an aspect ratio (height to width) that ranges between 1:10 to 20:1. The micro-feature geometry may be adjusted during the manufacturing of a cleaning layer such that the material can be used reshape, sharpen or refurbish the probe element tips.

Figure 6A:
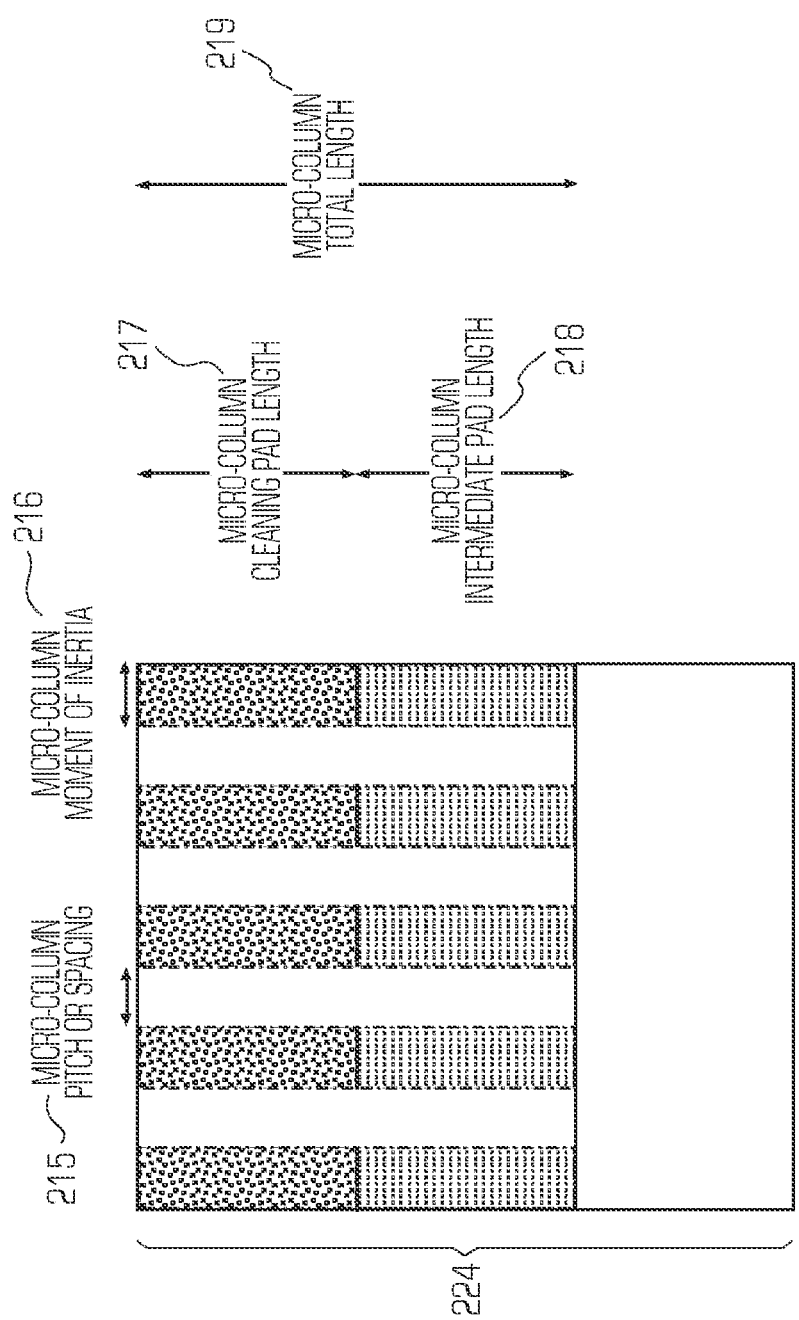
FIG. 6A is an enlarged sectional view of a evenly spaced micro-columns constructed from a combination of one or more intermediate material layers to attain a consistent cleaning efficacy into the contact area of a test probe.
Figure 6B:
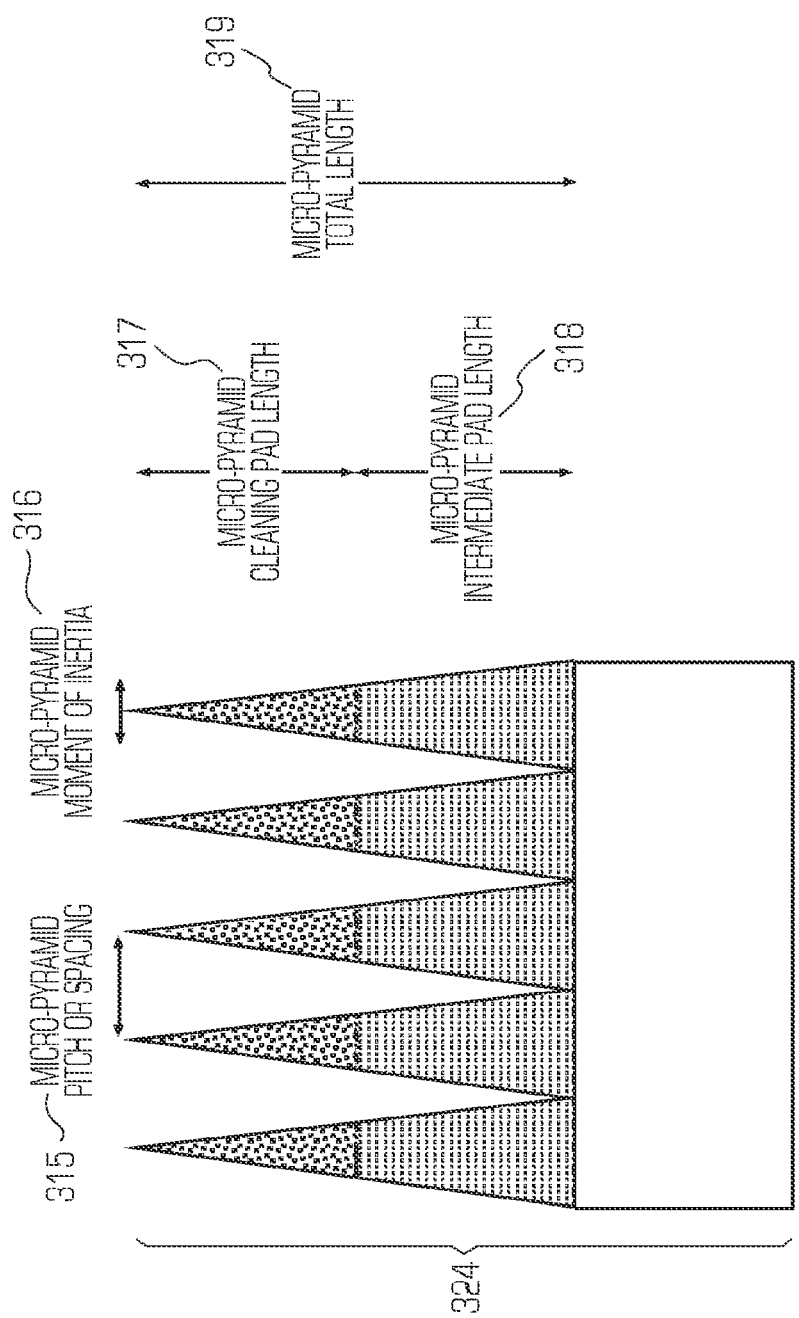
FIG. 6B is an enlarged sectional view of a evenly spaced micro-pyramids constructed from a combination of one or more intermediate material layers to attain a consistent cleaning efficacy into the contact area of a test probe.

In an embodiment, FIG. 6A and FIG. 6B show enlarged sectional views of a cleaning materials with micro-features (micro-columns 219 and micro-pyramidal 319 features of the cleaning material 224, 324, respectively); although, such features also could be any other regular geometrical feature. The deflection of a micro-feature under load depends not only on the load, but also on the geometry of the feature's cross-section.

In FIG. 6A, the micro-column spacing, or pitch, 215; the area moment of inertia or the second moment of inertia which is a property of a shape that can be used to predict the resistance of features to bending and deflection, 216; the cleaning pad length 217; the intermediate pad length 218; and the total length of the micro-column 219 are predetermined according the specific configuration of the contact element and the supporting hardware. For an array of pointed and/or spear shaped contact elements, the micro-column geometry is such that the cleaning features can fit "in-between" the contact elements as well as make physical contact with the contact elements to provide cleaning action and debris collection along the sides of the probe tips. In this example, a contact element interface design could have a contact element spacing (or pitch) of 125-microns for an exposed tip length of 360-micron. For the cleaning material, the feature major cross-sectional axis length would be less than 125-micron and the height would be at least 60-micron to facilitate overtravel into the cleaning material. The features would provide a reciprocal force onto the pointed and/or spear shaped contact elements to initiate a cleaning and/or material removal action. FIG. 6B, the micro-pyramid vertex spacing, or pitch, 315 and the variable moment of inertia 316 along the height, the cleaning pad pyramidal length 317, the pyramidal frustum height 318, and the total height of the micro-pyramid 319 are predetermined according the specific configuration of the contact element and the supporting hardware. As an example, for an array of multi-point crown shaped contact elements, the micro-pyramid geometry is such the cleaning material can fit within the tines of the crown-contact and make physical contact in between the contact elements to provide cleaning action and debris collection along the sides of the probe tips. For an array of multi-point crown shaped contact elements, the micro-feature geometry is such that the cleaning features can fit "in-between" and "within" the contact elements as well as make physical contact with the contact elements to provide cleaning action and debris collection along the sides of the probe tips. The shape of the micro-feature would be defined by the kerf (i.e, "street width and shape", and "avenue width and shape") if a precision cutting process is used or through a molded shape if a casting process is used. As an example, a contact element interface design could have a tine-to-tine spacing within the contact element of 125-microns, an exposed tine length of 300-micron, and a contact element spacing (or pitch) of 125-microns. For the micro-features of the cleaning material, the major cross-sectional axis length of the micro-feature top surface would be less than 125-micron to facilitate within contactor cleaning. The overall height would be at least 200-micron to facilitate overtravel into the cleaning material and provide a sufficient reciprocal force into the multi-point crown shaped tip of the contact elements to initiate the cleaning and/or material removal action.

The micro-features may have abrasive particles applied to the top surface, along the length of the micro-feature, within the body of the micro-feature, or at the base of the micro-feature. In one embodiment, an average micro-feature could have a cross-section widths of 1.0-μm or more, with a height of 400-μm or less and an average abrasive particle size of less than 15.0-μm. Typical abrasives that may be incorporated into and across the material layers and micro-features may include aluminum oxide, silicon carbide, and diamond although the abrasive particles may also be other well known abrasive materials with Mohs Hardness of 7 or greater. The amount and size of the abrasive material added to the micro-features may vary according the configuration and material of the contact elements to achieve a pad that will remove and collect the debris but will not damage the contact elements or support hardware.

Figures 7A, 7B, 7C:
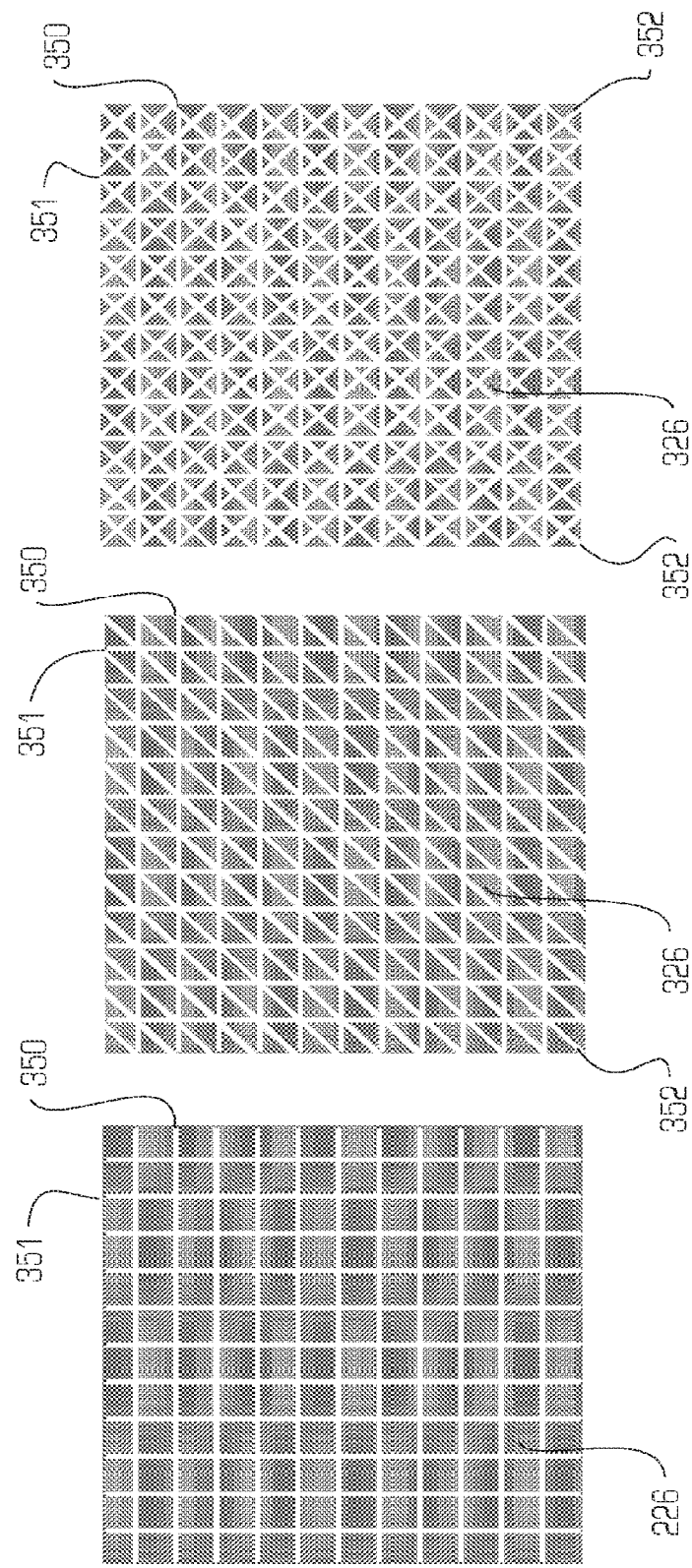
FIG. 7A is a plan view of a portion of mutually decoupled micro-features using an array of "streets" for resultant second moment of area or inertia to control the resistance to bending.
FIG. 7B is a plan view of a portion of mutually decoupled micro-features using an array of "avenues" for resultant second moment of area or inertia to control the resistance to bending.
FIG. 7C is a plan view of a portion of mutually decoupled micro-features using an array of diagonals for second moment of area or inertia to control the resistance to bending.

FIGS. 7A, 7B, and 7C are diagrams illustrating an embodiment of the cleaning material 224 and 324, respectively, in which the micro-features are mutually decoupled and formed with a predetermined moment of inertia using predetermined arrays of streets 351, avenues 352, and diagonals 353 to remove undesirable interactions and other coupled effects and attain a predetermined surface compliance so that when the pin elements contact the pad surface, a reciprocal force is imparted by the material into the contact area, within the contact element tip geometry, and support structures to increase the efficiency at which the debris and contaminates are removed. The widths of the streets, avenues, and diagonals size may vary according the configuration and material of the probe elements to achieve a decoupled material surface to uniformly remove the debris from the sides of the contact element and within the geometrical features contact element tip. The streets, avenues, and diagonals may have abrasive particles uniformly or preferentially distributed across the width. The width of the streets, avenues, and diagonals as well as the size of the abrasive material across the width may vary according the configuration and material of the contact elements.

The cleaning system and cleaning pad not only removes and collects adherent particulates from the contact element and supporting hardware surfaces, but maintains the shape and geometric properties of contact surface. The insertion of the contact elements of the tester interface into a cleaning device, such as the devices shown in FIG. 3A wafer device 20; FIG. 3B substrate device 21; and FIG. 3C dummy package device 22, removes adherent debris from the contact element and supporting hardware without leaving any organic residue that must be subsequently removed with an additional on-line of off-line process. Furthermore, the overall electrical characteristics of the contact element and the geometry are unaffected; however, the overall electrical performance needed for high yield and low contact resistance is recovered.

Now, a method for cleaning a plurality of probe elements and supporting hardware will be described. The method accomplishes the goal of removing the debris from contact elements without removing the tester interface from the ATE, thereby increasing the productivity of the tester. The cleaning device, that may have the same size and shape as typical DUTs being tested by the tester, may be inserted into a predetermined cleaning tray. The cleaning material layer of the device has predetermined physical, mechanical, and geometrical properties according the configuration and material of the contact elements and supporting hardware of the tester interface.

Figure 8A:
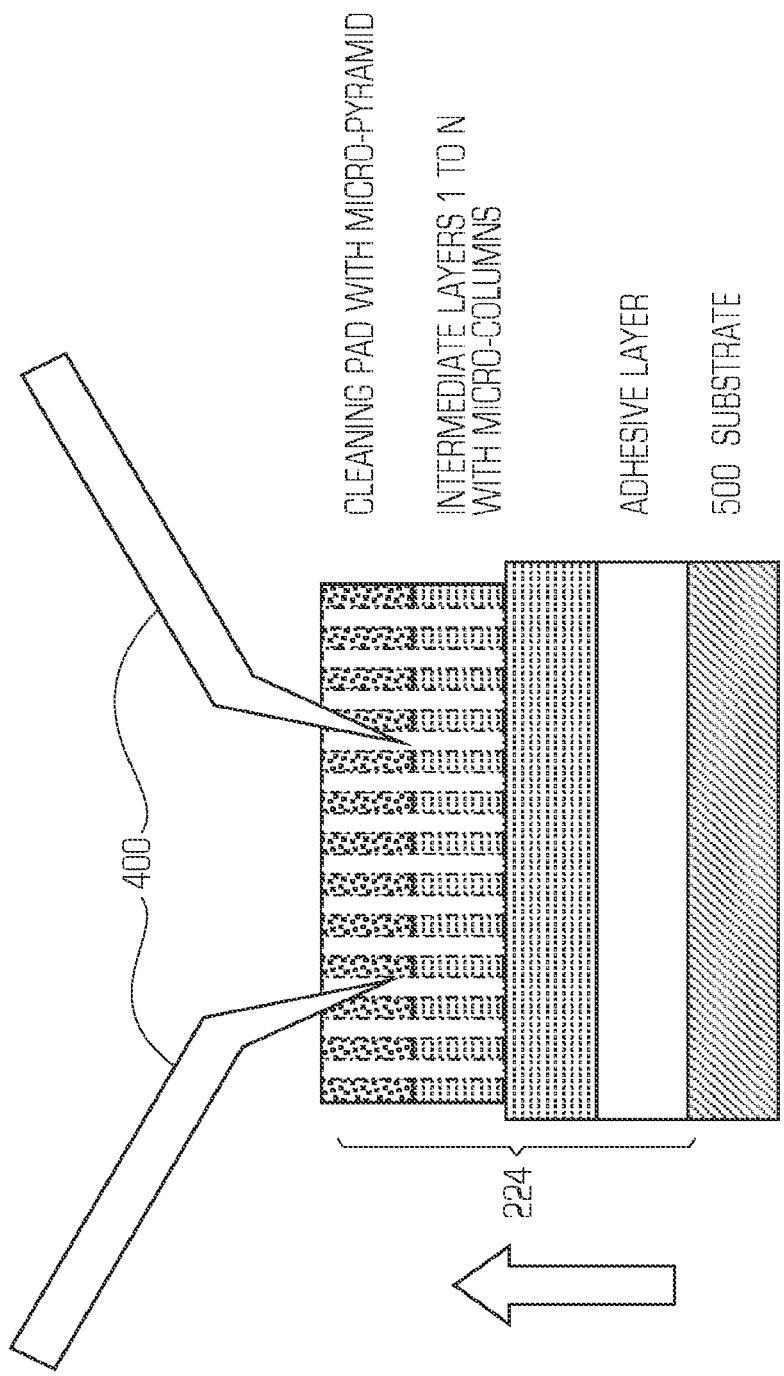
FIG. 8A is a sectional view of a cleaning material with micro-columns for cleaning the contact tip area of a cantilevered test probe for wafer level test.

An embodiment of the cleaning material with the micro-features suitable for cleaning the contact elements 13 of a tester interface 12 for wafer level test such as tungsten needles, vertical probes, cobra probes, MEMs type probes, plunger probes, spring probes, sliding contacts, contact bump probes formed on a membrane, etc. For this illustrative example, a standard cantilevered probe card, is shown in FIG. 8A. The cleaning material 224 is installed onto a wafer substrate 20 or a cleaning area substrate 500. At a specified interval, the contact elements are cleaned when the cleaning material 224 is driven in contact with the contact elements to some pre-set vertical position. The spacing 215, moment of inertia 216, and total length 219 of the micro-columns configured based on the configuration and material of the contact elements 400, in this case cantilevered probe needles. As the contact elements 400 are exercised into the cleaning material 224, debris is removed contact the surface of the contact element as well as along the side of the tip length. The spacing, geometry, and abrasiveness of the micro-columns is such that the reciprocal pressure on the contact elements imparts efficient cleaning to remove and collect debris from the contact elements.

As described above, this cleaning step may occur either when the cleaning device is periodically installed from the cleaning tray positioned under the contact elements of tester interface or every time from the wafer cassette, or anytime the ATE executes a cleaning operation of the contact elements with the cleaning material installed onto the burnishing plate. Use of the cleaning device does not interrupt, in any way, the operation of the ATE since the cleaning of the contact elements is accomplished during the normal operation of the testing machine. In this manner, the cleaning device is inexpensive and permits the contact element to be cleaned and/or shaped without removing the contact elements or tester interface from the ATE. Now, another embodiment of the cleaning device will be described.

Now, another embodiment of the cleaning device will be described wherein the cleaning device may be used for cleaning contact elements that are used to electrically test the DUTs wherein an individual semiconductor device from the wafer has been encapsulated into a material, such as plastic. The above embodiment would be typically used for a system that tests the wafers or one or more dies on a semiconductor wafer prior to being singulated and/or encapsulated into an assembled package. In this illustrative example, the cleaning device may also be used with an ATE and tester for handling and testing packaged integrated circuits (IC). The IC package may have one or more electrical leads or solder balls extending out from the package that communicate electrical signals, such as a power signal, a ground signal, etc., with the die inside of the package 15. The tester interface, in this case called test socket 12, will have a plurality of contact elements 13 (similar to the probe card tester described above) that contact the leads of the package and test the electrical characteristics of the packaged DUT. Commonly, the contact elements are mounted onto spring loaded test probes and a have geometrical configuration with single spear-like 403 or crown-like features with multiple tines 402.

Figure 8B:
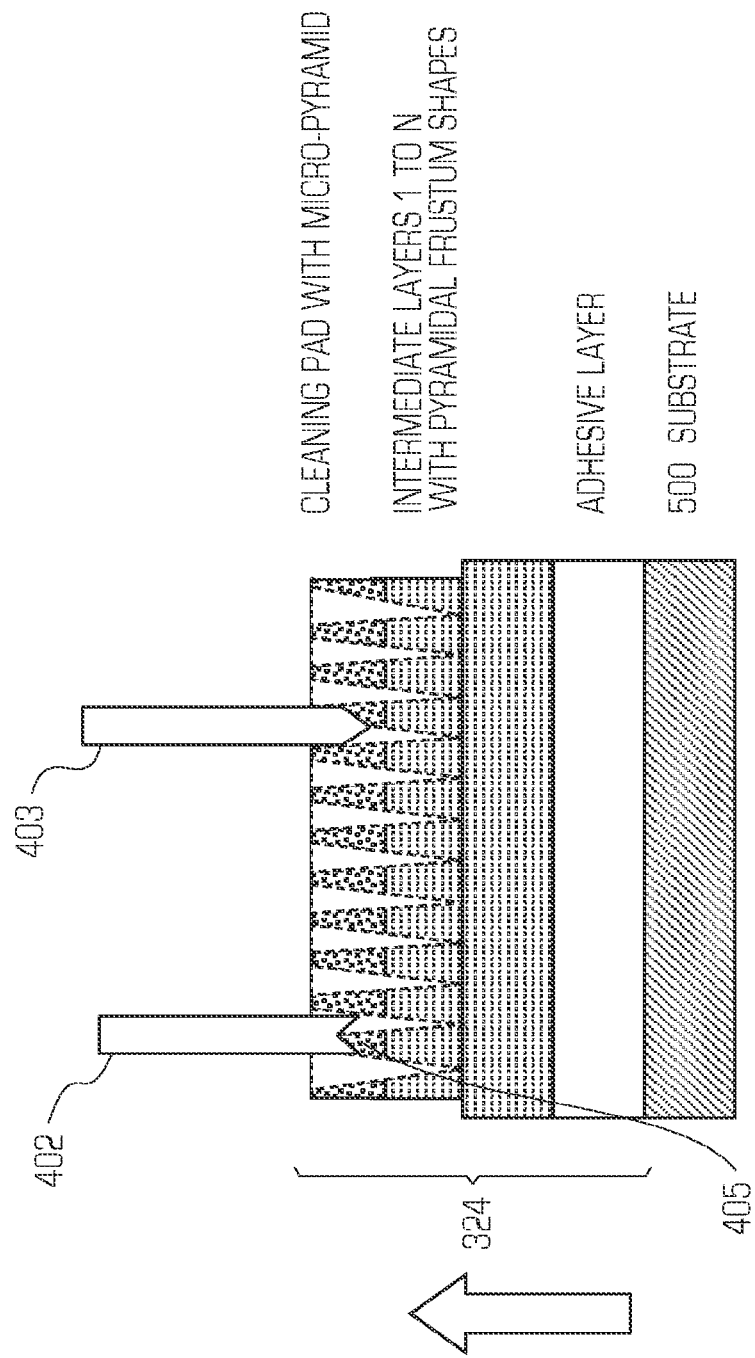
FIG. 8B is a sectional view of a cleaning material with micro-columns for cleaning the within contact tip of crown point and single point test probes used for wafer level, chip scale, and package level test.

Similar to the probe card cleaner embodiment, the cleaning device may approximate a DUT shape with a substrate onto which the cleaning pad material has been applied 22 such that contact elements of the test socket may contact the cleaning pad surface periodically to remove debris from the tips of the probe elements. The size of the cleaning device may be modified to fit the size and shape of the particular socket or to approximate the dimensions of a particular device. In the micro-featured embodiment shown in FIG. 8B, the micro-pyramid structures 324 may be used wherein the geometrical features of the cleaning device have spacing, geometry, and abrasiveness is such that the reciprocal pressure on the contact elements imparts efficient cleaning to remove and collect debris from the within the center of contact elements 405. Decoupling of the micro-pyramid structures 326, with streets 350, avenues 351, and diagonals 352, with widths and depths is predetermined according to the configuration and material of the contact elements. The spacing, geometry, and abrasiveness of the micro-pyramids is such that the reciprocal pressure on the contact elements imparts efficient cleaning to remove and collect debris from the contact elements. Thus, the number of pad/polymer/substrate layers and surface micro-features may be controlled to provide control of the overall thickness of the cleaning device as well as the compliance of the thickness of the cleaning. This multi-layer embodiment would also provide "edge-side" cleaning for the interior of the socket and contactors of the prober.

The methods and apparatus provide one or more advantages including but not limited to maintaining clean contactors and contact pins. While the disclosure has been described with reference to certain illustrative embodiments, those described herein are not intended to be construed in a limiting sense. For example, variations or combinations of steps in the embodiments shown and described may be used in particular cases without departure from the disclosure. Various modifications and combinations of the illustrative embodiments as well as other advantages and embodiments of the disclosure will be apparent to persons skilled in the arts upon reference to the drawings, description, and claims. It is intended that the scope of the disclosure be defined by the claims appended hereto and their equivalents.

While the foregoing has been with reference to a particular embodiment of the invention, it will be appreciated by those skilled in the art that changes in this embodiment may be made without departing from the principles and spirit of the disclosure, the scope of which is defined by the appended claims.

We claim:

1. A method for cleaning one or more pin contact elements and support hardware in a semiconductor testing apparatus, the method comprising:

loading a cleaning device, into the semiconductor testing apparatus that has one or more pin contact elements and support hardware, the cleaning device having a same physical configuration as IC semiconductor devices tested by the semiconductor testing apparatus, the cleaning device having a top surface with predetermined properties that clean the one or more pin contact elements, and one or more intermediate layers underneath the top surface, the one or more intermediate layers having a set of predetermined characteristics that are selected to optimize the cleaning device for one or more pin contact elements and support structures of testing interfaces, wherein the one or more intermediate layers have a modulus of elasticity range between more than 40-MPa to 600-MPa, each layer has a thickness between 25-um and 300-um and each layer has a hardness between 30 Shore A and 90 Shore A; and contacting the one or more pin contact elements and support hardware with the cleaning device during a normal testing operation of the semiconductor testing apparatus so that any debris is removed from the one or more pin contact elements and support hardware.

2. The method of claim 1, wherein the cleaning further comprises periodically loading one or more cleaning devices into the semiconductor testing apparatus when the one or more pin contact elements and support hardware are being cleaned.

3. The method of claim 1, wherein the loading further comprises loading one or more cleaning devices into one or more device carriers, along with semiconductor wafers having dies being tested by the semiconductor testing apparatus so that the one or more cleaning devices are contacted during a testing process of the devices.

4. The method of claim 1 further comprising maintaining the one or more pin contact elements and support hardware in a cleaned state for a longer period of time increasing yield performance and increasing an amount of revenue for a manufacturer.

5. The method of claim 1, wherein the cleaning device properties are selected for any given probe element material or shape to remove embedded or bonded debris from pin contact elements and support hardware reducing the amount of downtime needed for manual cleaning, increasing a testing throughput for a manufacturer.

6. The method of claim 1, wherein loading the cleaning device into the semiconductor testing apparatus further comprises loading the cleaning device into one of a wafer prober and a packaged device handler.

7. The method of claim 3, wherein loading the one or more cleaning devices into one or more device carriers further comprises loading the one or more cleaning devices into one of a wafer cassette and a JEDEC tray.

8. The method of claim 1 further comprising testing, using the semiconductor testing apparatus, a plurality of devices.

9. The method of claim 8, wherein testing the plurality of devices further comprises testing, using the semiconductor testing apparatus, one of an individual semiconductor die and a packaged semiconductor device.

10. The method of claim 5, wherein selecting the cleaning device properties further comprises selecting one of a density of the cleaning device top surface and an abrasiveness of the cleaning device top surface.

* * * * *